(12) United States Patent  (10) Patent No.: US 7,665,883 B2
Matheson                   (45) Date of Patent: Feb. 23, 2010

(54) POWER BOARD AND PLUG-IN LIGHTING MODULE

(75) Inventor: George E. Matheson, North Vancouver (CA)

(73) Assignee: Koninklijke Philips Electronics N.V., Eindhoven (NL)

( * ) Notice: Subject to any disclaimer, the term of this patent is extended or adjusted under 35 U.S.C. 154(b) by 137 days.

(21) Appl. No.: 11/485,992

(22) Filed: Jul. 14, 2006

(65) Prior Publication Data
US 2007/0091620 A1    Apr. 26, 2007

Related U.S. Application Data

(60) Provisional application No. 60/699,988, filed on Jul. 14, 2005.

(51) Int. Cl.
H01R 33/00 (2006.01)

(52) U.S. Cl. .................. 362/652; 362/640; 362/657

(58) Field of Classification Search ............. 362/249, 362/640, 652, 657–659
See application file for complete search history.

(56) References Cited

U.S. PATENT DOCUMENTS

| | | | |
|---|---|---|---|
| 4,920,467 A | | 4/1990 | Honsberger |
| 5,010,463 A | * | 4/1991 | Ross ..................... 362/253 |
| 5,499,445 A | * | 3/1996 | Boyle et al. ............. 29/830 |
| 5,543,586 A | | 8/1996 | Crane, Jr. et al. |
| 5,555,163 A | | 9/1996 | Pisani |
| 5,624,181 A | | 4/1997 | Miller et al. |
| 5,659,953 A | | 8/1997 | Crane, Jr. et al. |
| 5,842,773 A | | 12/1998 | Krebs |
| 6,058,634 A | | 5/2000 | McSpiritt |
| 6,132,859 A | | 10/2000 | Jolly |

(Continued)

FOREIGN PATENT DOCUMENTS

JP    10-021729    1/1998

(Continued)

OTHER PUBLICATIONS

Abhari, R., et al., "Physics-based CAD models for the analysis of vias in Parallel-Plate environments." IEEE Transactions on Microwave Theory and Techniques, vol. 49, No. 10, Oct. 2001.

(Continued)

*Primary Examiner*—Sandra L O'Shea
*Assistant Examiner*—Evan Dzierzynski

(57) ABSTRACT

The present invention provides a modular panel lighting apparatus comprising a multi layer power board and one or more lighting modules. The power board is a compound structure of one or more electrically conductive layers which are separated by one or more electrically insulating layers. The power board is configured to receive one or more lighting modules and can provide electrical, mechanical and thermal function adequate to meet a desired functionality of the lighting apparatus. A lighting module comprises one or more light-emitting elements operatively attached to a connector element that has one or more electrical contact portions. By inserting the connector element into the power board, the lighting module can be mounted anywhere on the face of the power board. When appropriately inserted into the power board, the one or more electrical contact portions of the connector element can establish selective electrical contact with the conductive layers of the power board and can secure the lighting module in place.

19 Claims, 3 Drawing Sheets

U.S. PATENT DOCUMENTS

| | | | |
|---|---|---|---|
| 6,161,942 A | 12/2000 | Liu | |
| 6,232,724 B1 | 5/2001 | Onimoto et al. | |
| 6,244,727 B1 | 6/2001 | Ryan, Jr. et al. | |
| 6,314,669 B1 | 11/2001 | Tucker | |
| 6,502,956 B1 | 1/2003 | Wu | |
| 6,683,665 B1 | 1/2004 | Matthies | |
| 6,712,486 B1 | 3/2004 | Popovich et al. | |
| 6,910,794 B2 * | 6/2005 | Rice | 362/547 |
| 6,919,581 B2 | 7/2005 | Natori | |
| 2002/0001192 A1 * | 1/2002 | Suehiro et al. | 362/240 |
| 2003/0189829 A1 * | 10/2003 | Shimizu et al. | 362/240 |
| 2005/0057943 A1 | 3/2005 | Mako et al. | |
| 2006/0215416 A1 * | 9/2006 | Lucas et al. | 362/545 |

FOREIGN PATENT DOCUMENTS

| | | |
|---|---|---|
| WO | WO94/03947 | 2/1994 |
| WO | WO01/59747 | 8/2001 |

OTHER PUBLICATIONS

Abhari, R., et al. "Equivalent circuit for multiple vias in a parallel plate environment," Electronics Letters, vol. 36, No. 17, pp. 1446-1447, Aug. 2000.

Abhari, R., et al. "Analysis of differential vias in a Multilayer parallel plate environment using a physics-based CAD model," 2001 IEEE International Microwave Symposium, Phoenix, AZ, pp. 2031-2034, May 2001.

Electro-Graf- http://graffitiresearchlab.com/?page_id=13 Feb. 2006.

LED Throwies—http://graffitiresearchlab.com/?page_id=17 Feb. 2006.

Magnetic Fridgerator Lights—http://www.instructables.com/ex/i/76D6F51E0A661029BC4A001143E7E506/ Mar. 2006.

Nickel, J.G., et al. "Signal Integrity System Solutions for High Speed Backplane Transmission and Connectors Integrated in Packages." Feb. 2003.

Nickel, J.G., Silicon Bandwidth Inc. "Decoupling Capacitance Platform for Substrates, Sockets and interposers". (http:www.siliconbandwidth.com/prod_welltech.htm) Feb. 2005.

* cited by examiner

POWER BOARD AND PLUG-IN LIGHTING MODULE

This application claims Priority from Provisional application 60/699,988 filed on Jul. 14, 2005.

FIELD OF THE INVENTION

The present invention pertains to the field of lighting systems and in particular to panel lighting systems incorporating light-emitting elements.

BACKGROUND

Advances in the development and improvements of the luminous flux of light-emitting devices such as semiconductor, organic or polymer light-emitting diodes (LEDs) have made these devices suitable for use in general illumination applications, including architectural, entertainment, and roadway lighting, for example. As such, LEDs are becoming increasingly competitive with light sources such as incandescent, fluorescent, and high-intensity discharge lamps.

Light-emitting diodes offer a number of advantages and are generally chosen for their ruggedness, long lifetime, high efficiency, low voltage requirements, and above all the possibility to control the color and intensity of the emitted light independently. They provide a great improvement over sensitive gas discharge lamps, incandescent bulbs, and fluorescent based lighting systems. Solid-state lighting sources have the capability to create similar lighting impressions but outweigh a number of drawbacks associated with other lighting technologies.

Many times it is required to create certain desired lighting effects such as homogeneous planar lighting impressions. To meet such requirements apparatuses were conceived that utilize modular elements in which the components can be easily placed, shaped, mounted, or maintained. Despite ongoing improvements in components and apparatus design, requirements for different shapes and forms still necessitate the assembly of tailor made components that entail a number of economic limitations. From a practical standpoint, any type of multipurpose lighting technology that allows for the building of a wide variety of solutions with a select few simple generic modular elements would be desirable.

A number of prior art references disclose the use of light-emitting devices in panel illumination or display apparatus. For example, U.S. Pat. Nos. 6,712,486, 6,683,665, 6,314,669 and 6,244,727 describe modular panel grid and array type lighting systems, which incorporate LEDs as the illumination source.

U.S. Pat. No. 6,058,634 discloses a LED lighting apparatus in a flat panel format used for illuminating customized light-emitting artwork. The lighting apparatus comprises a number of "tri-color" LEDs which are attached to a multi-layer printed circuit board (PCB). In order to mount the LEDs, the attachment and assembly process can only be done in a series of cutting, coating, and mounting steps which typically involve soldering. In addition, because of the employed tri-color LEDs and the color mixing control, the emitted light is limited to a range of orange colors including a pure saturated green and a pure saturated red.

Similarly, U.S. Pat. No. 6,232,724 discloses a "light emitting diode array" with a special-purpose designed signal interconnection board to which a number of LEDs are permanently mounted. The interconnection boards cannot be extended to create a homogeneous lit surface without leaving a substantial gap in between the LEDs, and can only be extended by means of a particular wiring system.

International Patent Application No. WO01/59747 discloses "light bodies for advertisements, displays and similar visible surfaces" which comprise a panel type assembly of serially connected LEDs on a modular PCB. The PCBs are pre-grooved such that custom sized large area LED modules can be easily truncated however the modules cannot be assembled to form a larger homogeneously lit surface without any additional optics. Individual modules can only be mounted to a detached base inside a special-purpose housing.

In addition, Silicon Bandwidth Inc. discloses a printed circuit board design with plated through holes and back drilled holes for use in high-density high-speed electrical signal interconnections. A technology white paper can be found at http://www.siliconbandwidth.com/prod_welltech.htm. The multi-layer board can be equipped with cylindrical holes to receive precisely manufactured variable length connector pins of packaged devices. However, only issues of electrical connectivity but no mechanical or thermal contact management are addressed and devices can only be placed at predetermined locations.

While there are many lighting systems that can achieve a homogeneously lit surface impression, the design of these systems is either monolithic or involves a number of custom made components that can require elaborate assembly procedures. In order to facilitate the design of customized lighting solutions and to simplify the assembly process, standardized modules need to be employed to substitute the function of otherwise custom-made components. Therefore there is a need for a new panel lighting system that enables the use of modular, rugged and easy to handle components.

This background information is provided to reveal information believed by the applicant to be of possible relevance to the present invention. No admission is necessarily intended, nor should be construed, that any of the preceding information constitutes prior art against the present invention.

SUMMARY OF THE INVENTION

An object of the present invention is to provide a power board and plug-in lighting module. In accordance with an aspect of the present invention, there is provided a lighting apparatus comprising: a lighting module including one or more connector elements, each of the one or more connector elements having two or more electrical contact portions, the lighting module including one or more light-emitting elements electrically and operatively connected to the two or more electrical contact portions; a multi layer power board having a sandwiched compound structure, said multi layer power board including two or more electrically conductive layers separated by one or more electrically insulative layer, said multi-layer power board including a electrically insulative layer on both a top and a bottom thereof, said multi-layer board adapted for providing electrical power to the lighting module; whereby upon penetration of said one or more connector elements into the multi-layer power board, each of the two or more electrical contact portions of each of the one or more connector elements form an electrical connection with one of the two of more electrically conductive layers.

In accordance with another aspect of the present invention, there is provided a lighting apparatus comprising: a lighting module including two or more connector elements, each of the two or more connector elements having one or more electrical contact portions, the lighting module including one or more light-emitting elements electrically and operatively connected to the two or more connector elements; a multi layer power board having a sandwiched compound structure, said multi layer power board including two or more electrically conductive layers separated by one or more electrically insulative layer, said multi-layer power board including a electrically insulative layer on both a top and a bottom thereof, said multi-layer board adapted for providing electrical power to the lighting module; whereby upon penetration of said two or more connector elements into the multi-layer power board, the one or more electrical contact portions of each of the two or more connector elements form an electrical connection with one of the two of more electrically conductive layers.

BRIEF DESCRIPTION OF THE FIGURES

FIG. 1b illustrates the single connector element lighting module from FIG. 1a.

DETAILED DESCRIPTION OF THE INVENTION

Definitions

Figure 1A:
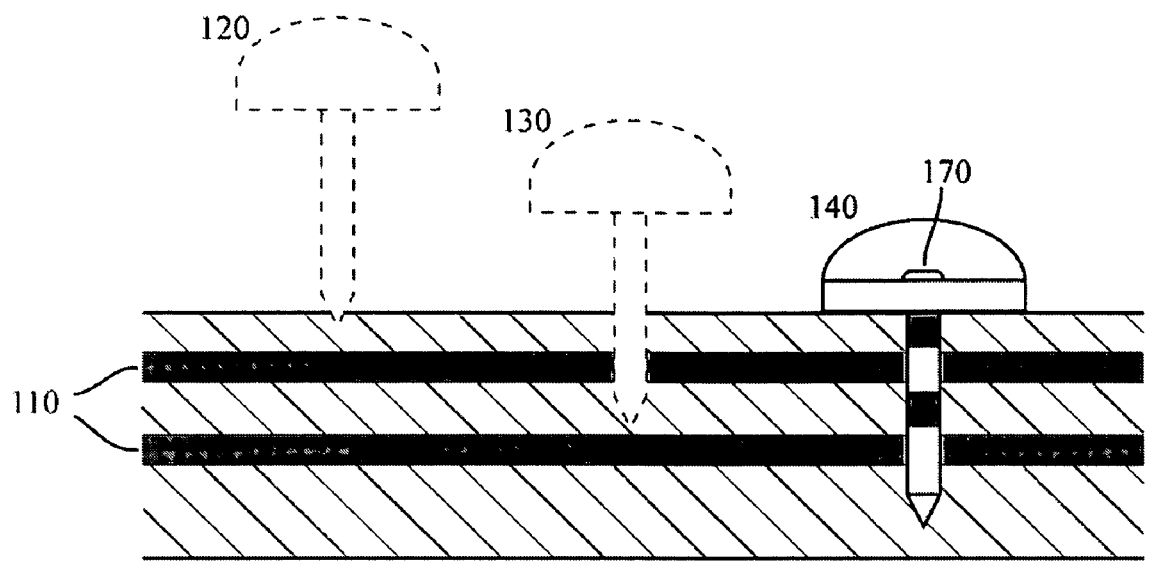
FIG. 1a illustrates a single connector element lighting module inserted into a power board according to one embodiment of the present invention.

The term "light-emitting element" is used to define any device that emits radiation in any region or combination of regions of the electromagnetic spectrum for example, the visible region, infrared and/or ultraviolet region, when activated by applying a potential difference across it or passing a current through it, for example. Therefore a light-emitting element can have monochromatic, quasi-monochromatic, polychromatic or broadband spectral emission characteristics. Examples of light-emitting elements include semiconductor, organic, or polymer/polymeric light-emitting diodes, optically pumped phosphor coated light-emitting diodes, optically pumped nano-crystal light-emitting diodes or any other similar light-emitting devices as would be readily understood by a worker skilled in the art. Furthermore, the term light-emitting element is used to define the specific device that emits the radiation, for example a LED die, and can equally be used to define a combination of the specific device that emits the radiation together with a housing or package within which the specific device or devices are placed.

As used herein, the term "about" refers to a +/−10% variation from the nominal value. It is to be understood that such a variation is always included in any given value provided herein, whether or not it is specifically referred to.

Unless defined otherwise, all technical and scientific terms used herein have the same meaning as commonly understood by someone of ordinary skill in the art to which this invention belongs.

The present invention provides a modular panel lighting apparatus comprising a multi layer power board and one or more lighting modules. The power board is a compound structure of one or more electrically conductive layers which are separated by one or more electrically insulating layers. The power board is configured to receive one or more lighting modules and can provide electrical, mechanical and thermal function adequate to meet a desired functionality of the lighting apparatus. The power board can be configured as a modular component which can be interconnected and extended with other power boards to cover a surface of desired shape and size. A lighting module comprises one or more light-emitting elements which is operatively attached to a connector element that has one or more electrical contact portions. The lighting module may further comprise a housing within which the one or more light-emitting elements are positioned. By inserting the connector element into the power board, the lighting module can be mounted anywhere on the face of the power board. The insertion process can self-form a receiving hole by mechanically piercing the board with the connector element, or the connector element can be inserted into preformed power board wells or holes, for example. When appropriately inserted into the power board, the one or more electrical contact portions of the connector element can establish selective electrical contact with the conductive layers of the power board and can secure the lighting module in place.

FIG. 1a illustrates a lighting apparatus according to one embodiment of the present invention having particular regard to the cross sectional region where a lighting module connector element penetrates a power board. The power board has layers of electrically conductive material 110 which are separated by and buried between layers of electrically insulating material. A lighting module 140 is shown fully inserted into the power board and also indicated are outlined positions 120 and 130 of a lighting module as it penetrates the power board at various depths. When a lighting module is properly inserted, the one or more connector elements can establish selective electrical contact with the conductive layers of the power board and thereby provide electrical power to the lighting module. The conductive layers of the board can be selectively connected to terminals of one or more multi-channel controllers which provide electrical power suitable to drive the light-emitting elements which are employed in the lighting modules.

Figure 1B:
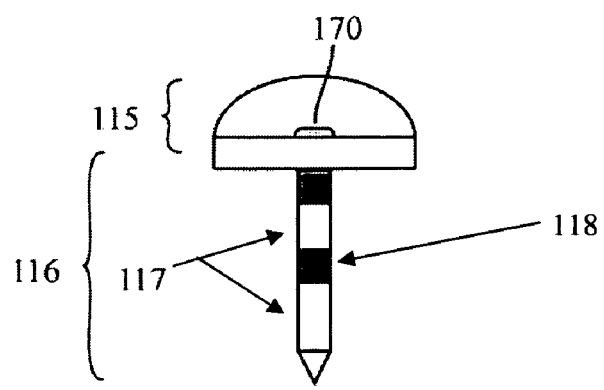

FIG. 1b illustrates a lighting module according to one embodiment of the present invention. The lighting module has a housing 115 which provides optical elements such as lenses and accommodates one or more light-emitting elements 170, and the lighting module further comprises a connector element 116. The connector element and the one or more light-emitting elements are electrically coupled in order to enable electrical connection between the power board and the one or more light-emitting elements, thereby enabling the operation and control of the light-emitting elements. The connector element and the housing can be a single integrally formed part or they can be detachable and re-attachable multiple times without damaging the components. The connector element can have one or more electrical contact portions 117 which can be single-pole or multi-pole connector elements, for example. The electrical contact portions 117 can be separated by an electrically insulative portion 118.

Figure 2:
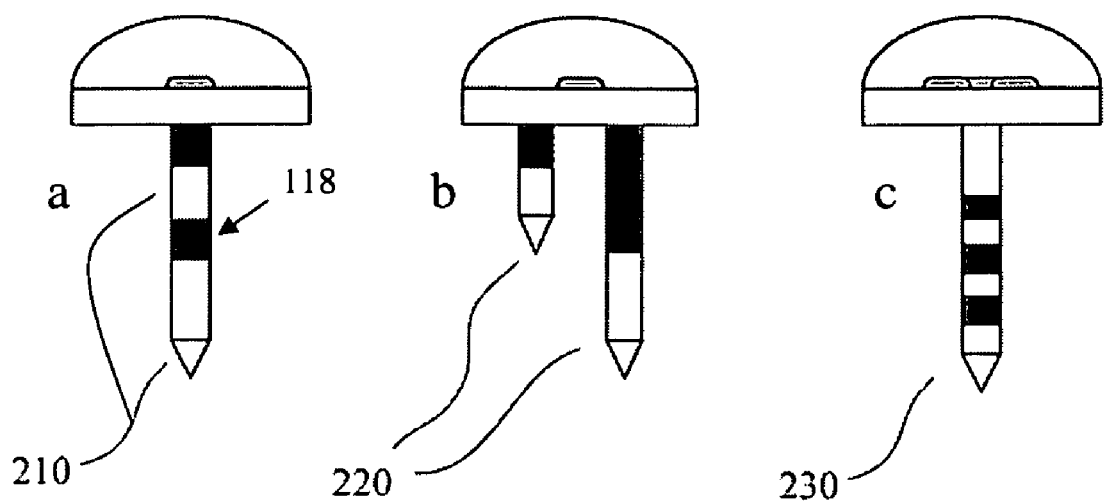
FIG. 2a illustrates a lighting module according to one embodiment of the present invention.
FIG. 2b illustrates a lighting module according to another embodiment of the present invention.
FIG. 2c illustrates a lighting module according to another embodiment of the present invention.

FIGS. 2a, 2b and 2c illustrate lighting modules according to different embodiments of the present invention, wherein the one or more connector elements are configured with a pointed end that is capable of piercing and self forming a receiving hole in the power board enabling electrical connection there between. FIG. 2a illustrates a lighting module comprising a single connector element having two electrical contact portions 210 and two electrically insulating portions 212. FIG. 2b illustrates a lighting module comprising two connectors elements 220, each having an electrical contact portion and an electrically insulating portion. Finally, FIG. 2c illustrates a single connector element 230 with a plurality of electrical contact portions and electrically insulating portions.

Figure 3:
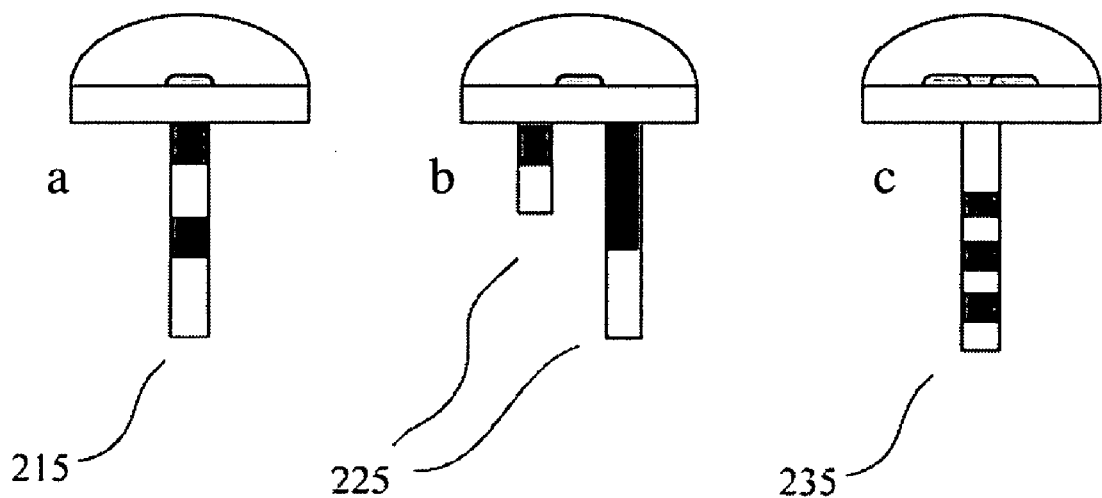
FIG. 3a illustrates a lighting module according to another embodiment of the present invention.
FIG. 3b illustrates a lighting module according to another embodiment of the present invention.
FIG. 3c illustrates a lighting module according to another embodiment of the present invention.

FIGS. 3a, 3b and 3c illustrate lighting modules according to different embodiment of the present invention, wherein the one or more connector elements are configured with a blunt end that is configured for insertion into suitable pre-formed holes in the power board enabling electrical connection there between. FIG. 3a illustrates a lighting module comprising a single connector element having two electrical contact portions 215 and two electrically insulating portions 217. FIG. 3b illustrates a lighting module comprising two connectors elements 225, each having an electrical contact portion and an electrically insulating portion. Finally, FIG. 3c illustrates a single connector element 235 with a plurality of electrical contact portions and electrically insulating portions.

Figure 4:
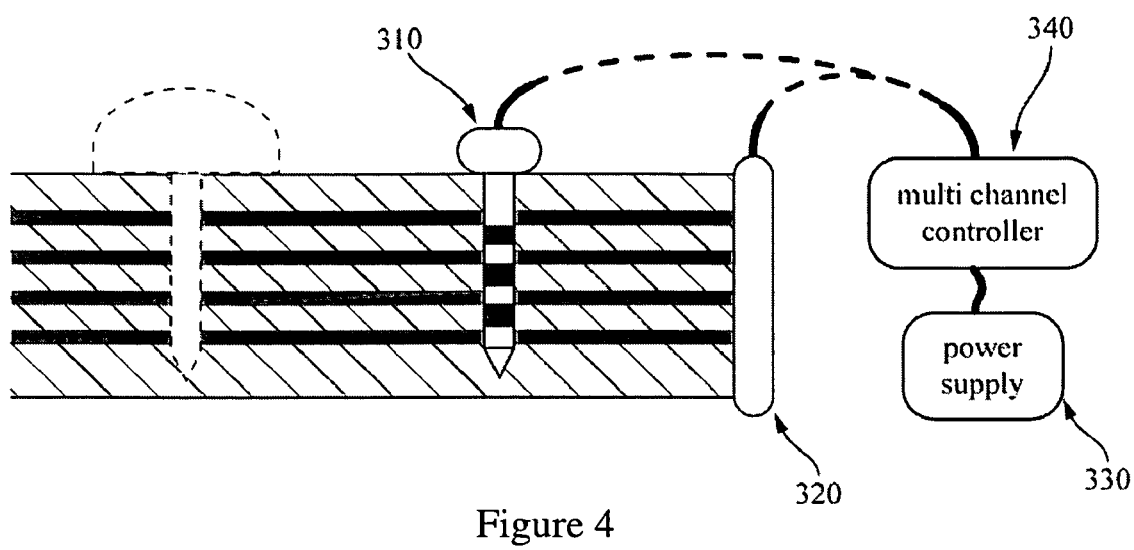
FIG. 4 illustrates two different configurations of power board connectors connecting a power board to a power supply means according to embodiments of the present invention.

FIG. 4 illustrates two embodiments of the present invention in which the lighting apparatus comprises a power board with four conductive layers, wherein these figures illustrate two different ways to connect the power board to a controller 340 and a power supply 330. In one embodiment of the invention, provision of electrical power to a power board can take the form of a push-in power connector 310 similar to the lighting module connector element, for example. The power connector can be attached to a cable or other extension to attach it to a controller 340 or power supply 330.

In another embodiment of the present invention, a power board connecter can have the form of a side-connecter 320 located at or along the perimeter of the power board, for example a tongue and groove, or pin and socket connector type enabling the connection between the power board and a controller and a power supply, as illustrated in FIG. 4.

Power Board

The power board is configured as a compound structure of one or more electrically conductive layers which are separated by one or more electrically insulating layers. The power board is configured to receive one or more lighting modules and can provide electrical, mechanical and thermal function adequate to meet a desired functionality of the lighting apparatus. The power board can be configured as a modular component which can be interconnected and extended with other power boards to cover a surface of desired shape and size.

A power board can be produced as a rigid, semi-rigid or malleable, flat or tubular piece, for example. In one embodiment, the power board is formed from materials that provide for the ease of cutting or trimming of the power board, thereby providing a means for the power board to be formed into any desired shape.

In one embodiment of the present invention, the power board can be produced as a roll or tape format that can be applied to a surface or pre-manufactured by reverse drawing, or extruding or casting to fit complex forms, for example.

In one embodiment of the present invention the power board is configured with two or more brass layers that are separated and buried by insulating silicone or ethylene propylene rubber layers which are durably adhered to each other to result in a sandwiched compound power board.

As would be known to a worker skilled in the art, there are a plurality of different electrically conductive materials from which the electrically conductive layers of the power board can be manufactured, wherein the choice of the material can depend on the desired structural rigidity, flexibility or other physical parameters. Likewise, the electrically insulative layers of the power board can be formed from any of a plurality of different electrically insulative materials.

In another embodiment of the present invention a power board comprises one or more layers conductive layers which are formed as conductive stripes which are laterally electrically insulated from each other. This may provide a means for electrically individually addressing a conductive strip by a suitable controller, for example. Conductive stripes can be perpendicularly separated and located in any of the conductive layer locations of the power board. The geometry of the conductive stripes can have any orthogonal, quadratic, rectangular, or non-linear alignment, for example.

In another embodiment of the present invention a power board comprises electrically conductive layers of pre-punched sheets, for example metal sheets, with pre-formed cross hair holes, or wells, one or more metallic screen mesh sheets, one or more layers of plastic, foam, or a combination thereof which are electrically conductive and capable of establishing durable and required electrical connectivity with a connector element of the one or more lighting modules.

In one embodiment, the face layer of a power board can have a surface on which pre-punched holes or any other markings outline predetermined lighting module placement, for example. In addition, the connector locations can be made as needed with a specifically formed tool such as a star or cross hair shaped punch tool, for example.

In an alternate embodiment of the present invention the connector element of a lighting module can be positioned anywhere on the power board by piercing and mechanically pushing the connector element of the lighting module into the power board without a previous cutting step.

In one embodiment of the present invention, a power board can include threaded or keyed holes which can provide a means for mechanical interconnection between a connector element of a lighting module and the power board.

In another embodiment of the present invention a power board comprises an epilayer of a material that durably self seals the surface or allows the lighting module to be glue-bonded, soldered, or welded to the surface to exclude environmental substances from penetrating at the site where a connector element pierces the surface of the power board, thereby providing environmental protection.

In another embodiment of the present invention a power board comprises means for cooling the lighting apparatus. Such means can be a material with enhanced heat transfer properties that can be utilized as a heat sink epilayer, or means to establish thermal contact between the power board and the attached one or more lighting modules.

In another embodiment of the present invention, the power board can have integrated heat conduction pathways or tunnels that can be connected to a forced or natural convection gas or liquid cooling system, or the power board can have integrated heat pipes that facilitate heat dissipation away from the attached one or more lighting modules.

In another embodiment of the present invention a power board comprises means to mechanically support the forced flow of liquid or gaseous materials in layers suitable to cool the lighting apparatus. In addition, such materials with suitable electrical conductivity can also be used to provide electricity to conductive layers or form a conductive layer for example, the electric common ground or any other electric pole of the lighting apparatus.

In one embodiment of the present invention a power board comprises an optical epilayer with a polished, painted, textured or otherwise structured surface of, for example, compound materials suitable to create a desired optical effect. Such optical effects can be characterized by color, absorption, specular or diffuse reflection, or transmission in order to create a desired effect caused by actively or passively lighting the epilayer of the power board.

In one embodiment of the present invention a power board comprises means to mechanically interconnect one or more other power boards either directly or via a suitable frame structure, for example. The resulting extended functional face area of the assembly of power boards can be of a flat nature or can have any other shape which can be approximated by the lateral extensions of the employed power boards. Additionally, the power board can be malleable, or flexible, for example, such that it can be formed into a desired shape.

In another embodiment, the power board can have layers of polymer, epoxy or other suitable materials that, when pierced by a connector element, will bond to the connector element thereby locking the positional orientation of the lighting module relative to the power board.

Lighting Module

A lighting module comprises one or more light-emitting elements which are attached to a connector element that has one or more electrical contact portions. The connector element and the one or more light-emitting elements are electrically coupled in order to enable electrical connection between the power board and the one or more light-emitting elements, thereby enabling the operation and control thereof. The lighting module may comprise a housing to which the one or more light-emitting elements are connected.

FIG. 1b illustrates a lighting module according to one embodiment of the present invention, which comprises a housing 115 which accommodates one or more optical elements such as lenses or mirrors, for example, and one or more light-emitting elements 170. The housing attaches to a connector element which comprises one or more electrical contact portions 117.

In one embodiment of the present invention, the housing comprises a substrate upon which the one or more light-emitting elements are mounted. The substrate may be thermally conductive thereby enhancing thermal transfer away from the one or more light-emitting elements associated with the housing. In one embodiment, the substrate can include circuit traces thereon enabling electrical connectivity between the one or more light-emitting elements and the electrical contact portions of a connector element.

In one embodiment of the present invention the housing has integrated therewith an optical element which can provide a means for manipulating the light emitted by the one or more light-emitting elements of the lighting module. The optical element can be a reflective element, refractive element, diffractive element, diffusive element or other optical element as would be readily understood by a worker skilled in the art. In one embodiment of the present invention, the optical element is a lens, reflector, diffuser, or other format of optical element as would be readily understood by a worker skilled in the art. In another embodiment of the present invention, an encapsulation material is provided to encapsulate the one or more light-emitting elements.

In one embodiment of the present invention, the housing is configured in order to environmentally protect the one or more light-emitting elements.

In one embodiment of the present invention, wherein multiple light-emitting elements are integrated into a lighting module, the light-emitting elements can be selected for the generation of one or more desired colours of emitted light. For example the light-emitting elements can be selected to be red, green and blue (RGB) or red, green, blue and amber (RGBA) or any other colours of light-emitting elements as would be readily understood by a worker skilled in the art.

In one embodiment of the present invention, the lighting module can have a switch or a current limiting element, for example, protecting the electronics of the lighting module during operation or during insertion of the lighting module into the power board. The fragmentation of alternating electrically insulating and conductive regions along the connector element in combination with the respective fragmentation across the power board can be such that a connector element can be inserted into or removed from the power board under operating conditions without causing electrical shortcuts.

In another embodiment of the present invention the housing and connector element of the housing are detachable such that the housing can be unfastened without detaching the connector element from the power board. Alternatively, the connector element and the housing can be a single integrally formed part or they can be detachable and re-attachable multiple times without damaging the components. The connector element can have one or more single-pole or multi-pole electrical contact portions. When a lighting module is properly inserted, the one or more electrical contact portions of the connector elements can establish selective electrical contact with the conductive layers of the power board and thereby provide electrical power to the lighting module. The conductive layers of the power board can be selectively connected to terminals of one or more multi-channel controllers which provide electric power suitable to drive the light-emitting elements which are employed in the lighting modules.

FIGS. 2a, 2b and 2c illustrate different configurations of the lighting module according to embodiments of the present invention, wherein the lighting module comprises a pointed single two-pole 210, four-pole 230 jack type connector element, and a pointed multi-pin single-pole connector element 220, respectively. FIGS. 3a, 3b and 3c illustrate different configurations of the lighting module according to embodiments of the present invention, wherein the lighting module comprises a single two-pole 215 or four-pole 235 jack type stump connector element, and a multi-pin single-pole stump connector element 225. Along each connector element, the electrical contact portions are separated by electrically insulating portions. The two or more electrical contact portions of a connector element can provide a means for the transfer of power and optional for the transfer of data.

In another embodiment of the present invention the connector element placement relative to the power board can be permanent such that if the lighting module and thus the connector element is forcefully removed from the power board, the lighting apparatus may be damaged.

In an alternate embodiment of the present invention, a connector element can be releasably connected the power board, thereby enabling removal or replacement of the lighting module, without damage. The secure attachment of the connector element to a power board can be provided by a number of different means, for example a connector element with a shaped cross section to help lock the connector element in position, a mechanical anchor similar to a wall anchor to hold the connector element in place, a hook and loop fastener like VELCRO®, a keyed connector element so that it may be inserted and twisted to hold the connector element in place, or a threaded screw connector element.

In one embodiment of the present invention the connector element, when fully inserted into a power board, completely remains within the board. In another embodiment of the invention the connector element clears the back side of the power board. Additionally, the portion of the connector element emerging on the opposite face of the power board can include an anchor or bolt attachment mechanism which can provide an securing mechanism for the connector element. This configuration of a connector element may also act as a heat sink or provide a connection to a secondary heat dissipation system, thereby enabling the heat transfer from the lighting module.

In one embodiment of the present invention, the one or more connector elements of a lighting module can be configured to operate as a thermally conductive element providing a means for transfer of heat away from the one or more light-emitting elements of the lighting module to which the connector element is thermally coupled.

In one embodiment of the invention the one or more connector elements may be hollow and filled with a substance that undergoes a multi-phase evaporation and liquefaction process in order to dissipate heat from the lighting modules by a combined conduction and convection process, such as in a heat pipe, or thermosyphon for example. In another embodiment, the hollow connector element can be connected to a gas or liquid filled forced convection system.

Power Connector

In one embodiment of the present invention and as illustrated in FIG. 4, provision of electrical power to a power board can take the form of a push-in power connector 310 with a pin similar to the lighting module connector element, for example. The power connector can be attached to a wiring means, for example a cable or other extension to attach it to a controller 340 and power supply 330. A wiring means with two or more electrically connected push-in power connectors, for example, can be used to interconnect two or more power boards to a controller or power supply to form a continuous electrical circuit within the lighting apparatus.

In another embodiment of the present invention, a power board connecter can have the form of a side-connecter 320 located at or along the perimeter of the power board, for example a tongue and groove, or pin and socket connector.

In an embodiment of the present invention there is provided a protection mechanism which can provide for the electrically protection of the lighting apparatus. This protection mechanism can be configured as a fuse or switch for fault protection which can be part of a power connector, power board member, or lighting module, for example.

The power connector can provide a means for enabling the control of the operation of the one or more lighting modules coupled to the power board. The control of the lighting modules can be provided by for example a switched current source which is controlled using a Pulsed Width Modulation (PWM) signal, Pulsed Code Modulation (PCM) signal or any other digital control method known in the art. Alternately, the control of the lighting modules can be provided by an analog control method as would be readily understood by a worker skilled in the art.

It is obvious that the foregoing embodiments of the invention are exemplary and can be varied in many ways. Such present or future variations are not to be regarded as a departure from the spirit and scope of the invention, and all such modifications as would be obvious to one skilled in the art are intended to be included within the scope of the following claims.

I claim:

1. A lighting apparatus comprising:
    a) a lighting module including one or more connector elements, each of the one or more connector elements having two or more electrical contact portions, the lighting module including one or more light-emitting elements electrically and operatively connected to the two or more electrical contact portions; and
    b) a multi layer power board having a sandwiched compound structure, said multi layer power board including two or more electrically conductive layers separated by one or more electrically insulative layer, said multi-layer power board including an electrically insulative layer on both a top and a bottom thereof, said multi-layer board adapted for providing electrical power to the lighting module;
    whereby upon penetration of said one or more connector elements into the multi-layer power board, each of the two or more electrical contact portions of each of the one or more connector elements form an electrical connection with one of the two or more electrically conductive layers;
    wherein the one or more connector elements are configured as a heat pipe or a thermosyphon, said one or more light-emitting elements being thermally coupled to the one or more connector elements.

2. The lighting apparatus according to claim 1, wherein the one or more of the electrically conductive layers are formed as conductive stripes, wherein said conductive stripes are laterally electrically insulated from one another.

3. The lighting apparatus according to claim 1, wherein the lighting module further comprises a housing within which the one or more light-emitting elements are positioned.

4. The lighting apparatus according to claim 3, wherein the housing comprises one or more optical elements configured to manipulate light emitted by the one or more light-emitting elements.

5. The lighting apparatus according to claim 4, wherein the one or more optical elements are selected from the group comprising reflective element, refractive element, diffractive element and diffusive element.

6. The lighting apparatus according to claim 1, wherein the top of the power board comprises an optical epilayer configured to manipulate light emitted by the one or more light-emitting elements.

7. The lighting apparatus according to claim 1, wherein the one or more connector elements are configured to pierce and form a receiving hole in the power board.

8. The lighting apparatus according to claim 1, wherein the one or more connector elements are configured to be inserted into one or more preformed holes within the power board.

9. The lighting apparatus according to claim 8, wherein the one or more connector elements and the one or more preformed holes are compatibly threaded or keyed, thereby providing mechanical interconnection therebetween.

10. The lighting apparatus according to claim 1, wherein the heat pipe or thermosyphon includes a substance that undergoes a multi-phase process to dissipate heat from the lighting module.

11. A lighting apparatus comprising:
    a) a lighting module including two or more connector elements, each of the two or more connector elements having one or more electrical contact portions, the lighting module including one or more light-emitting elements electrically and operatively connected to the two or more connector elements; and
    b) a multi layer power board having a sandwiched compound structure, said multi layer power board including two or more electrically conductive layers separated by one or more electrically insulative layer, said multi-layer power board including an electrically insulative layer on both a top and a bottom thereof, said multi-layer board adapted for providing electrical power to the lighting module;

whereby upon penetration of said two or more connector elements into the multi-layer power board, the one or more electrical contact portions of each of the two or more connector elements form an electrical connection with one of the two or more electrically conductive layers;

wherein at least one of the two or more connector elements is configured as a heat pipe or a thermosyphon, said one or more light-emitting elements being thermally coupled to the at least one of the two or more connector elements.

12. The lighting apparatus according to claim 11, wherein the one or more of the electrically conductive layers are formed as conductive stripes, wherein said conductive stripes are laterally electrically insulated from one another.

13. The lighting apparatus according to claim 11, wherein the lighting module further comprises a housing within which the one or more light-emitting elements are positioned.

14. The lighting apparatus according to claim 13, wherein the housing comprises one or more optical elements configured to manipulate light emitted by the one or more light-emitting elements.

15. The lighting apparatus according to claim 14, wherein the one or more optical elements are selected from the group comprising reflective element, refractive element, diffractive element and diffusive element.

16. The lighting apparatus according to claim 11, wherein the two or more connector elements are configured to pierce and form a receiving hole in the power board.

17. The lighting apparatus according to claim 11, wherein the two or more connector elements are configured to be inserted into preformed holes within the power board.

18. The lighting apparatus according to claim 17, wherein one of the two or more connector elements and the preformed holes are compatibly keyed, thereby providing mechanical interconnection therebetween.

19. The lighting apparatus according to claim 11, wherein the heat pipe or thermosyphon includes a substance that undergoes a multi-phase process to dissipate heat from the lighting module.

* * * * *